Aug. 18, 1959 J. J. DAVIDSON 2,900,456

DIRECT COUPLED FEEDBACK TRANSISTOR AMPLIFIER CIRCUITS

Filed April 30, 1956

INVENTOR.
James J. Davidson
BY H. O. Newton
ATTORNEY.

United States Patent Office 2,900,456

Patented Aug. 18, 1959

2,900,456

DIRECT COUPLED FEEDBACK TRANSISTOR AMPLIFIER CIRCUITS

James J. Davidson, Audubon, N.J., assignor to Radio Corporation of America, a corporation of Delaware Application April 30, 1956, Serial No. 581,538

6 Claims. (Cl. 179—171)

Figure 1:
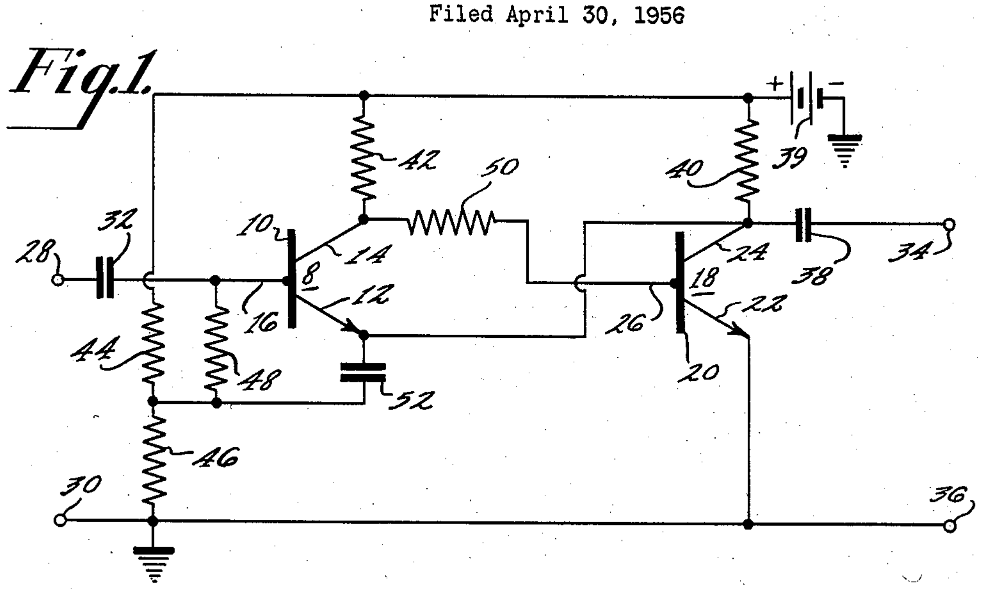

This invention relates to signal translating circuits, and in particular to signal amplifier circuits utilizing semi-conductor signal ampifying devices such as transistors.

The alternating current input impedance of a transistor is normally relatively low. This characteristic is not desirable in circuit applications where a transistor is used and the impedance of the signal source is relatively high. Such circuits might include, for example, a signal source such as a vacuum tube, a crystal or ceramic phonograph pickup, or a microphone, each of which may be a relatively high impedance device. Another difficulty which may be associated with the use of transistors in such circuits is that the direct current operating point of the transistors may vary with variations in temperature or when transistors are interchanged in the circuit, for example. As the operating point changes, signal distortion may result which is undesirable.

It is accordingly an object of the present invention to provide an improved transistor signal amplifying circuit which is stable in operation despite variations in temperature, the interchange of transistors in the circuit, and the like.

It is another object of the present invention to provide an improved signal amplifier circuit utilizing transistors as active signal amplifying elements therein which is characterized by a high input impedance and stable circuit operation.

It is yet another object of the present invention is provide an improved signal amplifier circuit wherein variations in the operating point of the transistors used therein are minimized and which has a relatively high dynamic input impedance.

An improved signal amplifier circuit embodying the invention may include a pair of semi-conductor signal amplifying devices, such as transistors. An input signal from a high impedance signal source, for example, may be applied to the base electrode of the first transistor and an amplified output signal may be derived from the collector of the second transistor. The collector of the first transitor is direct current conductively connected to the base of the second transistor, while the emitter of the first transistor is direct current conductively coupled to the collector of the second transistor. By these connections, changes in the operating point of one transistor will compensate for variations in the operating point of the other transistor. The connection from the collector of the second transistor to the emitter of the first provides alternating current signal feedback from the output of the second transistor in series with the applied input signal. Since the output signal is in phase with the input signal, the input impedance of the circuit is made relatively high. Accordingly, stable operation and a high input impedance may be simultaneously achieved.

Figure 2:
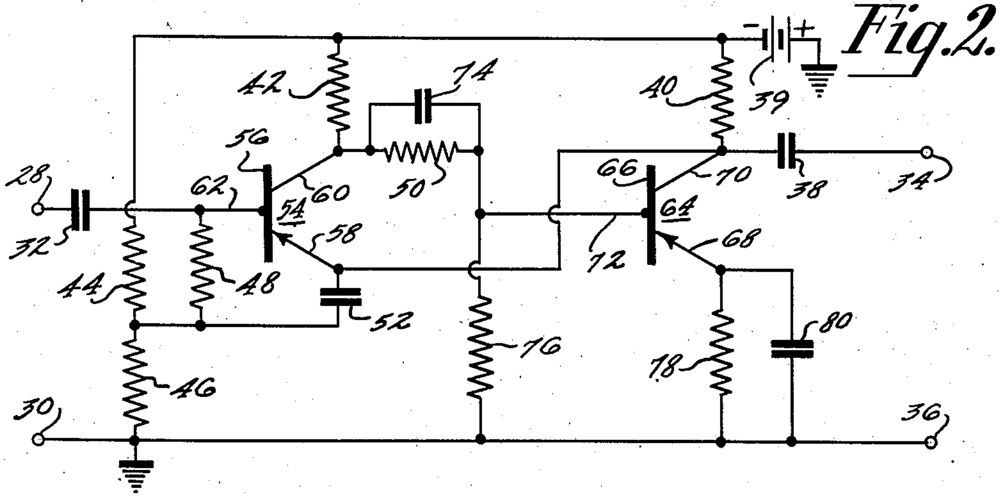
Figure 3:
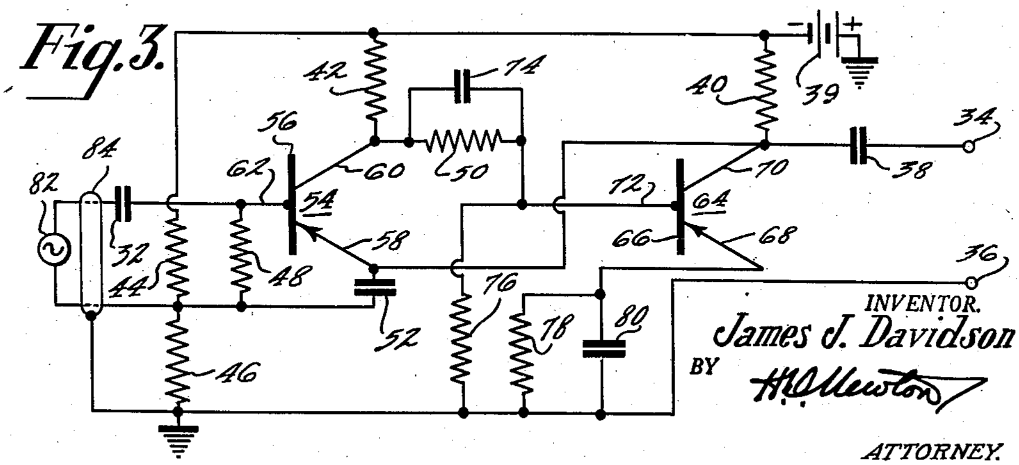

The novel features that are considered characteristic of this invention are set forth with particularity in the appended claims. The invention itself, however, both as to its organization and method of operation, as well as additional objects and advantages thereof, will best be understood from the following description when read in connection with the accompanying drawing, in which:

Figures 1, 2, and 3 are schematic circuit diagrams of transistor signal translating circuits illustrating various embodiments of the present invention.

Referring now to the drawing, wherein like parts are indicated by like reference numerals throughout the figures, and referred particularly to Figure 1, a two-stage amplifier circuit includes a pair of transistors 8 and 18 which may be considered to be junction transistors of the N-P-N type, although other types of transistors may be used. The transistors 8 and 18 includes respective semiconductive bodies 10 and 20, and emitter 12 and 22, collector 14 and 24, and base 16 and 26 electrodes respectvely. Input signals are applied to the circuit from a signal source, which may have a high impedance, through a pair of input terminals 28 and 30. The terminal 30 is connected to a point of reference potential or circuit ground, while the terminal 28 is connected through a coupling capacitor 32 to the base 16 of the first transistor 8. An amplified output signal may be derived from a pair of output terminals 34 and 36. The output terminal 36 is connected to the circuit ground point, while the output terminal 34 is connected through a coupling capacitor 38 to the collector 24 of the second transistor 18. To provide direct current biasing potentials for the transistors 8 and 18, a battery 39 is provided, the negative terminal of which is connected to ground. The positive terminal of the battery 39 is connected through respective load resistors 40 and 42 to the collectors 24 and 14 of the transistors 18 and 8 respectively. To provide a substantially fixed base bias voltage for the first transistor 8, the positive terminal of the battery 39 is connected through a pair of resistors 44 and 46, which form a voltage dividing network, to the circuit ground point. A resistor 48 is connected from the junction of the voltage divider resistors 44 and 46 to the base 16.

To provide operating point stabilization for the transistors 8 and 18 and at the same time to achieve a high dynamic input impedance for the circuit in accordance with the invention, the collector 14 of the first transistor 8 is direct current conductively connected through a series coupling resistor 50 to the base 26 of the second transistor 18, while the emitter 12 of the first transistor 8 is direct current conductively connected to the collector 24 of the second transistor 18. Further in accordance with the invention, and to complete the circuit, a capacitor 52 is connected from the emitter 12 of the first transistor 8 to the junction of the voltage divider resistors 44 and 46.

By connecting the electrodes of the transistor as shown and described, direct current and alternating current signal feedback are provided which simultaneously serve to stabilize the circuit operation and to effect the desired high input impedance for the amplifier circuit. The stabilizing feature of the invention can be demonstrated by assuming there is an increase in ambient temperature, for example, sufficient to cause the collector current of the first transistor 8 to increase. If the collector current of the transistor increases due to any cause, the voltage drop across the collector load resistor 42 will cause the base 26 of the second transistor 18 to become less positive. This will cause the collector current of the second transistor 18 to decrease, with the result that the voltage on the emitter electrode of the first transistor 8 will become more positive, which will tend to reduce the circuit bias between the emitter 12 and the base 16 of the transistor 8. This reduction in the forward bias will decrease the collector current to a proper value. The same type stabilization is achieved if the collector current of the second transistor 18 increases or if the collector current in both the transistors increases simultaneously. In accordance with the invention, therefore, the operating point of each transistor is made inversely dependent on the operating point of the other transistor to give a high degree of circuit stability.

It can also be demonstrated that by connecting the electrodes of the transistors as described, a high dynamic input impedance is provided for the circuit. This is accomplished by feeding back the signal voltage output from the collector 24 of the second transistor 18 to the emitter electrode 12 of the first transistor 8. If, for example, an input signal is applied to the input terminals 28 and 30, this signal will be applied to the base 16 of the transistor 8 or between the base 16 and circuit ground. The applied input signal will be implified by the transistor 8 and applied between the base 26 and the emitter 22 of the transistor 18. The amplified signal voltage appearing in the collector 24 of the second transistor 18 is then fed back from the collector 24 to the emitter 12 of the first transistor 8, and coupled through the coupling capacitor 52 to the junction of the voltage divider resistors 44 and 46. Accordingly, the signal voltage at the emitter 12 of the first transistor 8, and the signal voltage at the junction of the voltage divider resistors 44 and 46 will be in phase with the input signal, and of substantially the same amplitude tending to oppose strongly any current flow from the input signal applied to the input terminals 28 and 30. In this manner, the feedback circuit will raise the input impedance and lower the output impedance. The resulting input impedance for any given application may be in the order of megohms. The circuit is also characterized by a relatively low output impedance and wide bandwidth.

The voltage divider network comprising the resistors 44 and 46 is effective to fix the direct current voltage at the base 16 of the first transistor 8 at a substantially fixed value. By connecting the capacitor 52 between the emitter 58 and the junction of these resistors, the signal voltage at the junction of these resistors will vary with variations in the output signal. The output signal is substantially equal to the input voltage. By connecting the base 16 to the junction point of the voltage divider resistors 44 and 46 through the resistor 48, which has resistance of a large enough magnitude to keep the base-to-emitter impedance of the transistor at some predetermined value but of small enough magnitude that the direct-current base current through the resistor causes a reasonably small voltage drop, the direct current voltage on the base 16 is held fixed. Accordingly, the alternating current signal voltages which are applied to either end of the resistor 48 are substantially equal and in phase, creating a very high alternating current impedance on the base 16 and for the amplifier circuit, while allowing a relatively low direct current impedance.

In the embodiment of the invention illustrated in Figure 2, a two-stage amplifier circuit includes two transistors 54 and 64 which, in this case, are illustrated as being of N type conductivity and may be considered to be P–N–P junction transistors, for example. The transistor 54 includes a semiconductive body 56 and emitter 58, collector 60 and base 62 electrodes. The second transistor 64 also includes a semiconductive body 66 and an emitter 68, a collector 70 and a base 72. Since the transistors 54 and 64 are of N type conductivity, the polarity of the biasing battery 39 is reversed so that its positive terminal is grounded. Another difference in the circuit illustrated in Figure 2 is that a capacitor 74 is connected in parallel with the coupling resistor 50, which is connected between the collector 60 of the first transistor and the base 72 of the second transistor 64. The capacity 74 provides a separate signal conveying path between these two electrodes and is effective to increase the alternating current gain of the circuit to raise the input impedance to even a higher value. Another difference in this circuit is that a resistor 76 is connected between the base 72 and ground of the second transistor 64, and a resistor 78, which is by-passed by a capacitor 80, is connected between the emitter 68 and ground. These connections determine the operating bias of the second transistor 64 and are an aid to stabilizing the operating point of this transistor. In operation, the circuit illustrated in Figure 2 is similar to the one illustrated in Figure 1 and provides operating point stabilization and a high input impedance.

A circuit of the type illustrated in Figure 2 has been built and tested with transistors of the commercial type 2N109. While it will be understood that the circuit specifications may vary according to the design for any particular application, the following circuit specifications as used are included for the circuit of Figure 2 by way of example only:

| | |
|---|---|
| Resistors 40, 42, 44, 46, 48, 50, 76, and 78 | 47,000; 22,000; 68,000; 33,000; 12,000; 15,000; 8200; and 10,000 ohms, respectively. |
| Capacitors 52, 74, and 80 | 100; 1; and 100 microfarads, respectively. |
| Battery 39 | —90 volts. |

The power gain of an amplifier circuit of the type illustrated in Figure 2 may be slightly greater than 30 db and may have substantially unity voltage gain. The input impedance of such a circuit is proportional to the current gain of the transistors, and is somewhat dependent on the load impedance. For a load of 1 megohm, for example, the input impedance will be 6.8 megohms, while for a 2,000 ohm load the input impedance will be 3.3 megohms and will decrease to approximately 1 megohm for a 200 ohm load.

For some applications, it may be desirable to achieve a high degree of circuit stability with a circuit having a relatively low input impedance. This may be accomplished by connecting the input signal source to the amplifier circuit in the manner shown in the embodiment of the invention illustrated in Figure 3. The circuit of Figure 3 is substantially similar to the circuit illustrated in Figure 2, except that one terminal of a relatively low impedance signal source 82 is coupled through a shielded cable 84 and the coupling capacitor 32 to the base 62 of the first transistor 54, while the other terminal of the signal source 82 is connected to the junction of the voltage divider resistors 44 and 46, and through the capacitor 52 to the emitter 58 of the transistor 54. The external shield of the cable 84 is connected to circuit ground as shown. By virtue of this input coupling, the alternating current feedback is effectively removed so that the input impedance of the circuit is relatively low. At the same time, however, the operating points of the transistors 54 and 64 are stabilized in the same manner as the case of the circuits illustrated in Figures 1 and 2.

Operating point stabilization of transistor amplifier circuits embodying the invention is provided to effect stable circuit operation despite variations in temperature and the like. In addition, circuits embodying the invention are easily adapted to provide a high input impedance or alternatively, a relatively low input impedance.

What is claimed is:

1. A signal amplifier circuit comprising, in combination, a first transistor including base, emitter, and collector electrodes, a second transistor including base, emitter, and collector electrodes, said transistors being of the same conductivity type, means providing a signal input circuit for said amplifying circuit including a pair of input terminals, means connecting one of said terminals to a point of reference potential in said circuit, means coupling the other of said terminals to the base electrode of said first transistor for applying an input signal thereto, means providing a source of biasing potential connected to said point of reference potential, first resistive load means connecting the collector electrode of said first transistor with said source and providing variation in the collector voltage of said first transistor in response to collector current variation thereof, second resistive load means connecting the collector electrode of said second transistor with said source, means including a voltage divider network connecting the base electrode of said first transistor with said source, a capacitor connected from the emitter electrode of said first transistor to an intermediate point of said network, means connecting the emitter of said second transistor to said point of reference potential, means providing a signal coupling and direct current conductive connection between the collector electrode of said first transistor and the base electrode of said second transistor to provide signal translation therebetween and variation of the collector current of said second transistor in response to collector current variation of said first transistor, means providing a direct current conductive connection between the collector electrode of said second transistor and the emitter electrode of said first transistor to provide variation in the emitter voltage of said first transistor in response to collector current variation of said second transistor and signal feedback from the collector electrode of said second transistor to said input circuit through said capacitor for stabilizing the operation of said amplifying circuit and providing a high input impedance therefor, and means providing a signal output circuit connected with the collector electrode of said second transistor.

2. A stabilized signal amplifier circuit comprising in combination, a first transistor including base, emitter, and collector electrodes, signal input means connected for applying an input signal to said base electrode, a second transistor including base, emitter, and collector electrodes, said transistors being of the same conductivity type, signal output means connected for deriving an output signal from the collector electrode of said second transistor, means providing a source of biasing potential including a pair of terminals, first load resistance means connecting the collector electrode of said first transistor with one terminal of said source, second load resistance means connecting the collector electrode of said second transistor with said one terminal of said source, means connecting the emitter of said second transistor with the other terminal of said source, means providing a signal coupling and direct current conductive connection between the collector electrode of said first transistor and the base electrode of said second transistor to provide signal translation therebetween and variation of the base voltage and collector current of said second transistor in response to collector current variation of said first transistor, and means providing a direct current conductive connection between the collector electrode of said second transistor and the emitter electrode of said first transistor to provide variation of the emitter voltage of said first transistor in response to collector current variation of said second transistor and in a direction to oppose collector current variation of said first transistor, for stabilizing the operation of said amplifier circuit.

3. A signal amplifier circuit comprising, in combination, a first transistor including base, emitter, and collector electrodes, a second transistor including base, emitter, and collector electrodes, said transistors being of the same conductivity type, signal input means including signal coupling means connected with said first base electrode for applying an input signal thereto, a capacitor connected between the emitter electrode of said first transistor and said signal coupling means, means providing a signal coupling and direct current conductive connection between the collector electrode of said first transistor and the base electrode of said second transistor to provide signal translation therebetween and variation of the collector current of said second transistor in response to collector current variation of said first transistor, means providing a direct current conductive connection between the collector electrode of said second transistor and the emitter electrode of said first transistor to provide variation in the emitter voltage of said first transistor in response to collector current variation of said second transistor and signal feedback from the collector electrode of said second transistor to said signal input means through said capacitor for stabilizing the operation of said amplifying circuit and providing a high input impedance therefor, and means providing a signal output circuit connected between the collector and emitter electrodes of said second transistor.

4. A signal amplifier circuit comprising, in combination, a first transistor including base, emitter, and collector electrodes, a second transistor including base, emitter, and collector electrodes, said transistors being of the same conductivity type, means providing an input circuit for said amplifying circuit including a pair of input terminals, means connecting one of said terminals to a point of reference potential in said circuit, means coupling the other of said terminals to the base electrode of said first transistor for applying an input signal thereto, means providing a source of biasing potential, first resistive load means connecting the collector electrode of said first transistor with said source and providing variation in the collector voltage of said first transistor in response to collector current variation thereof, second resistive load means connecting the collector electrode of said second transistor with said source, a voltage divider network including a pair of resistors connected between said source and said point of reference potential, a capacitor connected between the emitter electrode of said first transistor and the junction of said pair of resistors, a third resistor connected between the base electrode of said first transistor and the junction of said pair of resistors, means connecting the emitter electrode of said second transistor to said point of reference potential, means providing a signal coupling and direct current conductive connection between the collector electrode of said first transistor and the base electrode of said second transistor to provide signal coupling therebetween and variation of the collector current of said second transistor in response to collector current variation of said first transistor, means providing a direct current conductive connection between the collector electrode of said second transistor and the emitter electrode of said first transistor to provide variation in the emitter voltage of said first transistor in response to collector current variation of said second transistor and signal feedback from the collector electrode of said second transistor to said input circuit through said capacitor for stabilizing the operation of said amplifying circuit and providing a high input impedance therefor, and means providing a signal output circuit connected with the collector electrode of said second transistor.

5. A signal amplifier circuit comprising, in combination, a first transistor including base, emitter, and collector electrodes, a second transistor including base, emitter, and collector electrodes, said transistors being of the same conductivity type, means providing a signal input circuit for said amplifying circuit connected for applying an input signal to the base electrode of said first transistor, means providing a source of biasing potential connected with said first and second collector electrodes for applying biasing potential thereto, impedance means connecting the base electrode of said first transistor with said source, a capacitor connected between the emitter electrode of said first transistor and an intermediate point of said impedance means, means providing a signal coupling and direct current conductive connection between the collector electrode of said first transistor and the base electrode of said second transistor to provide signal coupling therebetween and variation of the collector current of said second transistor in response to collector current variation of said first transistor, means providing a direct current conductive connection between the collector electrode of said second transistor and the emitter electrode of said first transistor to provide variation in the emitter voltage of said first transistor in response to collector current variation of said second transistor and signal feedback from the collector electrode of said second transistor to said input circuit through said capacitor for stabilizing the operation of said amplifying circuit and providing a high input impedance therefor, and means providing a signal output circuit connected between the collector and emitter electrodes of said second transistor.

6. A signal amplifier circuit comprising in combination, a first transistor including base, emitter, and collector electrodes, signal input circuit means connected for applying an input signal to said base electrode, means providing a signal coupling connection between said emitter electrode and said signal input circuit means, a second transistor including base, emitter, and collector electrodes, said transistors being of the same conductivity type, signal output means connected for deriving an output signal between the collector and emitter electrodes of said second transistor, means providing a source of biasing potential connected with said transistors for applying biasing potentials thereto, means providing a signal coupling and direct current conductive connection between the collector electrode of said first transistor and the base electrode of said second transistor to provide signal coupling therebetween and variation of the base voltage of said second transistor in response to collector current variation of said first transistor, and means providing a direct current conductive connection between the collector electrode of said second transistor and the emitter electrode of said first transistor, said last named means being effective to provide varation of the operating point of said first transistor in response to variation of the operating point of said second transistor to stabilize the operation of said amplifier circuit and to provide signal feedback to said input means through said signal coupling connection to increase the input impedance of said amplifier circuit.

References Cited in the file of this patent

UNITED STATES PATENTS

| | | |
|---|---|---|
| 2,730,576 | Caruthers | Jan. 10, 1956 |
| 2,751,549 | Chase | June 19, 1956 |

FOREIGN PATENTS

| | | |
|---|---|---|
| 523,250 | Belgium | Apr. 3, 1954 |